United States Patent [19]
Keefe et al.

[11] Patent Number: 5,642,045
[45] Date of Patent: Jun. 24, 1997

[54] MAGNETIC FIELD GRADIOMETER WITH IMPROVED CORRECTION CIRCUITS

[75] Inventors: George Andrew Keefe, Montrose; Roger Hilsen Koch, Amawalk, both of N.Y.

[73] Assignee: International Business Machines Corporation, Armonk, N.Y.

[21] Appl. No.: 516,846

[22] Filed: Aug. 18, 1995

[51] Int. Cl.$^6$ .................. G01R 33/022; G01R 33/025; G01R 33/04; G01V 3/08
[52] U.S. Cl. .................. 324/244; 324/225; 324/247; 324/253; 324/345; 364/571.01
[58] Field of Search .................. 324/225, 244, 324/245, 247, 248, 249, 251–255, 258, 260, 345, 346; 33/355 R–357, 363 R; 340/870.33; 364/571.01, 571.02

[56] References Cited

U.S. PATENT DOCUMENTS

| | | | |
|---|---|---|---|
| 3,398,360 | 8/1968 | Behr et al. | 324/254 X |
| 4,327,498 | 5/1982 | Setter et al. | 324/225 X |
| 4,475,078 | 10/1984 | Itani | 324/254 X |
| 5,113,136 | 5/1992 | Hayashi et al. | 324/248 X |
| 5,122,744 | 6/1992 | Koch | 324/248 |
| 5,187,436 | 2/1993 | Mallick | 324/225 X |

OTHER PUBLICATIONS

W.M. Wynn et al, IEEE Transactions on Magnetics, vol. MAG-11, No. 2, Mar. 1975 pp. 701–707, entitled "Advanced Superconducting Gradiometer/Magnetometer Arrays and a Novel Signal Processing Technique".

*Primary Examiner*—Gerard R. Strecker
*Attorney, Agent, or Firm*—Stephen S. Strunck

[57] ABSTRACT

An improved magnetic field gradiometer having major and minor correction circuits is disclosed. The major correction circuits cancel the main components of an applied magnetic field, such as the earth's uniform field, and the minor correction circuits correct for smaller, but still significant effects, such as assembly imperfections and unavoidable cross-talk between the elements of the gradiometer. Also disclosed is a method for processing the gradient data from the gradiometer to enable the positions of magnetic objects to be located in space.

21 Claims, 7 Drawing Sheets

MAGNETIC FIELD GRADIOMETER WITH IMPROVED CORRECTION CIRCUITS

This invention was made with Government support under Contract N61331-93-C-0058 awarded by the Department of the Navy. The Government has certain rights in this invention.

BACKGROUND OF THE INVENTION

The present invention pertains to gradiometer sensors for the measurement of magnetic field gradients.

Portable magnetic field sensors have been used extensively to locate magnetic objects and to magnetically characterize the surface of the Earth. Applications range from the use of a total field magnetometer mounted on an airplane to detect the magnetic field of a submarine, or map the magnetic field of the Earth, to the use of hand-held generators and detectors of low frequency ac magnetic fields to find coins on the beach or cracks in airplane wings.

Using portable magnetic field sensors, one can measure the magnitude of the field, $|B|$, with a total field magnetometer, the three vector components of the field, $B_x$, $B_y$, and $B_z$, with a vector magnetometer, or the gradient of the field with respect to direction, $G_{i,j} = \partial B_i/\partial j$ where $i,j = x, y, z$, with a magnetic field gradiometer. Each measurement choice has implications as to the design of the magnetic field sensor and the ability to convert the raw data measured by the sensor into information about the objects to be detected or the composition of the nearby environment.

Portable sensors inevitably experience small rotations of the sensor as they are moved. In almost all applications, the Earth's field of 50 µT represents a far larger signal than the magnetic field from the object being measured, which typically is less than 1 nT. Total field magnetometers are naturally invariant to rotation, and hence are often used while moving. Portable vector magnetometers have not been used while in motion to measure the self-fields of objects since the rotations of the sensor as it is moved almost always produce far larger changes in the output than the magnetic field of the object of interest. Even the most sensitive systems for measuring and correcting the rotations of a moving platform are not sensitive enough to prevent the signal from a moving vector magnetometer from being contaminated by these rotations. Portable gradiometers are not affected by these rotations because the typical magnitude of the magnetic field gradient of the Earth is usually the same size or smaller than the magnetic field gradients from objects of interest. Hence the rotations of a gradiometer sensor as it is moved are usually not relevant and/or can be easily compensated.

Any magnetic data, once measured, must then be inverted to obtain information about the source. A major limitation of a full field magnetometer is a fundamental mathematical limit in the ability to convert the measured magnetic field magnitude along a typical trajectory of motion (one number vs. position) into information about the location and/or size of the object or objects creating the magnetic field. Both the vector magnetic field (three numbers vs. position) or magnetic field gradient (five numbers vs. position) along typical trajectories, can be used to uniquely locate a small number of magnetic objects and determine their magnetic moment. As discussed above, measuring the vector magnetic field to sufficient accuracy from a moving platform is virtually impossible. On the other hand, it has long been appreciated that a portable magnetic field gradiometer could be used aboard a moving and rotating platform and would provide far superior ability to locate and characterize magnetic objects when compared to a full field magnetometer.

Until recently the most sensitive portable gradiometers have been based on superconducting technology. These sensors usually have a superconducting coil wound in a figure-8 pattern. Such a coil is insensitive to the application of a uniform magnetic field. A gradient in the field, however, creates a persistent current flowing around the coil which can be measured using a superconducting quantum interference device (SQUID). Such systems are extremely sensitive to magnetic field gradients and have been successfully used to locate and identify objects. The difficulty with these systems has been the cost and complexity of making and using superconducting components.

Recently, a new type of gradiometer, the three sensor gradiometer, (TSG), was invented that allows the gradient to be measured by differencing the outputs of two spatially separated sensor magnetometers effectively operating in a constant or zero magnetic field. This TSG, which is described in U.S. Pat. No. 5,122,744 (which is incorporated herein by reference), does not exhibit hysteresis, can be fabricated easily and inexpensively with both high Tc and low Tc superconductive materials and provides a high sensitivity.

In this TSG, a reference magnetometer is rigidly mounted to the sensor magnetometers. The reference magnetometer provides a signal via feedback coils to cancel background magnetic fields (e.g., the earth's relatively large background field) from outputs of the sensor magnetometers. Since the uniform field cancellation is done magnetically, it is not necessary to subtract large voltages to provide a small gradient thus the sensor has excellent linearity and common mode rejection ratio. Two gradient field signals which do not include the large background magnetic field are subtracted from each other electronically and divided by the distance between the field sensors to provide the measured average gradient.

Thus, a high sensitivity may be obtained by a system which is very inexpensive. The gradiometer is particularly advantageous when high Tc superconductive materials are used for fabrication. Either the reference magnetometer and/or one or both of the sensor magnetometers may be a SQUID, but it is not required that it be so. Any vector magnetometer (e.g., a fluxgate magnetometer) may be used to replace any of the reference and/or sensor magnetometers. Higher order gradiometers can be built using a reference magnetometer cube and a plurality of sensor magnetometer cubes.

SUMMARY OF THE INVENTION

An improved magnetic field gradiometer having major and minor correction circuits is disclosed. The major correction circuits cancel the main components of an applied magnetic field, such as the earth's uniform field, and the minor correction circuits correct for smaller, but still significant effects, such as assembly imperfections and unavoidable cross-talk between the elements of the gradiometer. Also disclosed is a method for processing the gradient data from the gradiometer to enable the positions of magnetic objects to be located in space.

BRIEF DESCRIPTION OF THE DRAWINGS

The invention is more particularly described in the following detailed description taken in conjunction with the accompanying drawings in which.

DETAILED DESCRIPTION OF THE INVENTION

Figure 1:
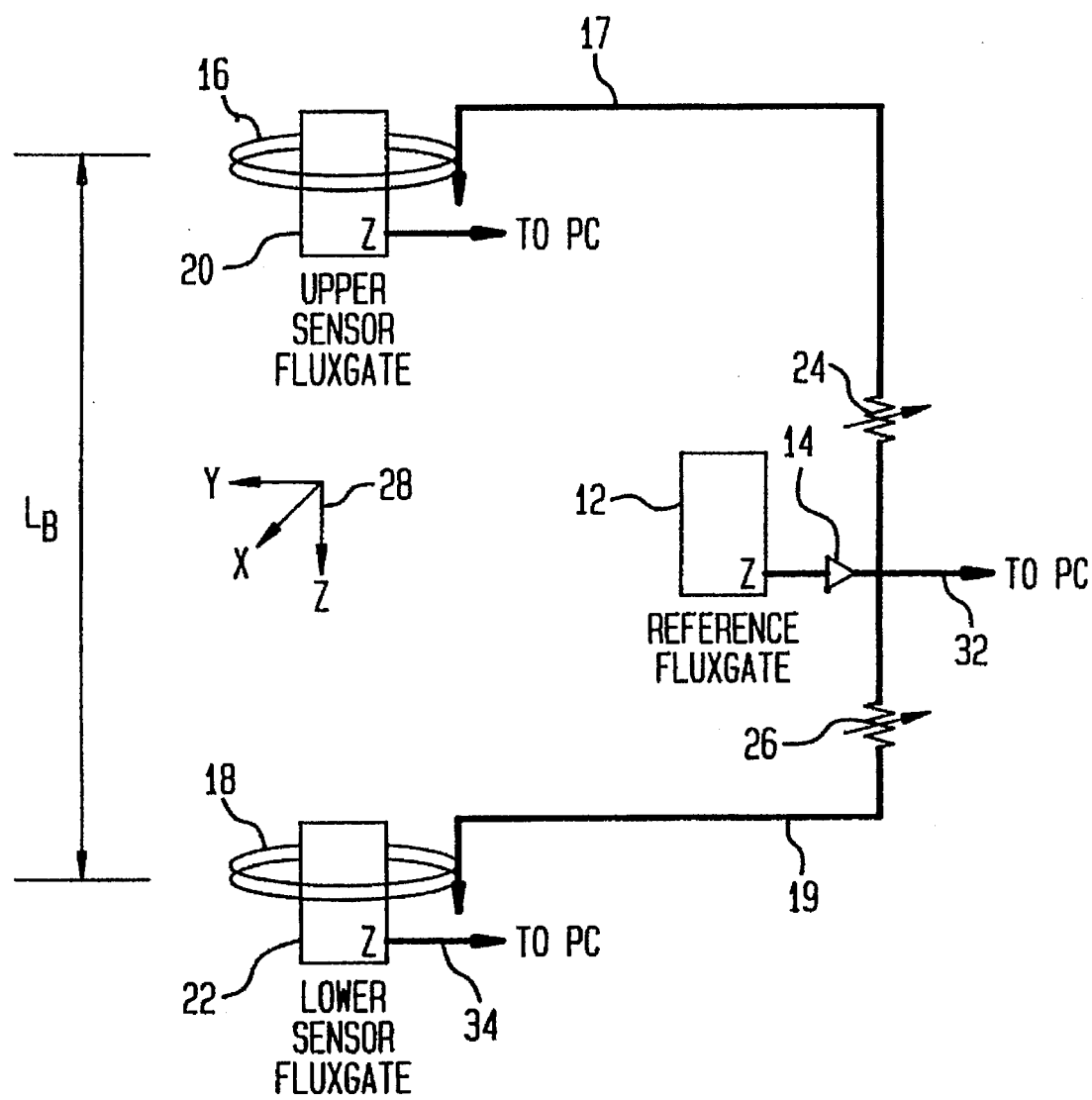
FIG. 1 is a schematic representation of a gradiometer showing the parallel arrangement of the major coils.

FIG. 1 is a conceptual drawing of a simplified gradiometer 10 that can only measure the gradient in the z-direction ($\partial B_z/\partial_z$). Reference fluxgate 12 measures the z component of the magnetic field at its location. This output is amplified, buffered by op amp 14 and applied in parallel to coils 16, 18 around each of the two sensor fluxgates 20, 22 as shown in FIG. 1. The exact value of the currents in each of the coils is adjusted using resistors 24 and 26 such that when a uniform magnetic field is applied along the z-axis, as noted by axis designator 28, the two sensor fluxgates 20, 22 in effect operate in zero magnetic field. This condition is defined as the gradiometer being balanced.

The difference between the magnetic field at reference fluxgate 12 and at each of the sensor fluxgates 20, 22 is a measure of the magnetic field gradient in that direction. When balanced, the only magnetic field that sensor fluxgates 20, 22 experience is this gradient (and higher-order spatial derivatives of the magnetic field). Since sensor fluxgates 20, 22 are, in effect, not operating in the relatively large uniform field of the Earth, a simple subtraction of the output of the two sensor fluxgates, divided by the separation in distance between the two fluxgates $L_B$, is the magnetic field gradient in that direction. This subtraction is done after digitization of the analog outputs 30, 32, 34 of fluxgates 20, 12, and 22, respectively. Alternatively, the subtraction may be done with the analog outputs 30, 32, and 34 followed by digitization of the result.

It is possible to drive coils 16, 18 in series like coils 21, 22, 23 of FIG. 6 of the U.S. Pat. No. 5,122,744. In that case, wire 17 to coil 16 would be extended to coil 18 and wire 19 and resistor 26 would not be present. Generally, the parallel arrangement of FIG. 1 is easier to make, easier to align (balance) using resistors 24, 26, but may be non-linear due to heating effects (due to different current flows in the wires to loops 16 and 18). The parallel arrangement is usually acceptable for low performance systems. Use of high resistance or non/low temperature dependent wire for the coils is helpful in reducing or eliminating the non-linearity due to temperature effects.

Higher performance systems are generally based on the series arrangement of the coils. Since the current in the coils is the same in this arrangement, there is no non-linearity problem. However, this arrangement is more difficult to balance as the current is the same in both magnetometers.

This concept of a three sensor gradiometer (TSG) allows the magnetic subtraction of the Earth's uniform magnetic field before the net magnetic field applied to each sensor magnetometer is converted to an output voltage level. This approach makes the determination of the difference between the outputs of the sensor magnetometers tractable. When 3-axis fluxgate magnetometers (such as Billingsly Magnetics Model DM60-3AR) are used for the magnetometers (as opposed to a SQUID), a room-temperature TSG (rtTSG) results which has a sensitivity when stationary of approximately $1 \times 10^{-11} T/m\sqrt{Hz}$ at 1 Hz and a baseline $L_B$ of 0.27 m. Such a gradient sensitivity implies that the magnetic field noise of each sensor at 1 Hz is $\leq 2 \times 10^{-12} T/\sqrt{Hz}$. Since the Earth's field is approximately $3 \times 10^7$ times bigger than this level, the difference between two magnetometers operated as a bare gradiometer (without a reference magnetometer or field cancellation coils), would have to be measured to 1 part in $3 \times 10^7$. This corresponds to 150 dB of common mode rejection, which is virtually impossible with conventional electronics. The use of the TSG concept allows this instrument to achieve this level of sensitivity using commercial electronics and an inexpensive 16 bit analog to digital (A to D) converter. This is an advantage of the TSG approach to a gradiometer compared to the approach of simply subtracting the output of two magnetometers operating in the Earth's field (a bare gradiometer). The TSG concept removes the common mode error introduced by the Earth's magnetic field.

Figure 2:
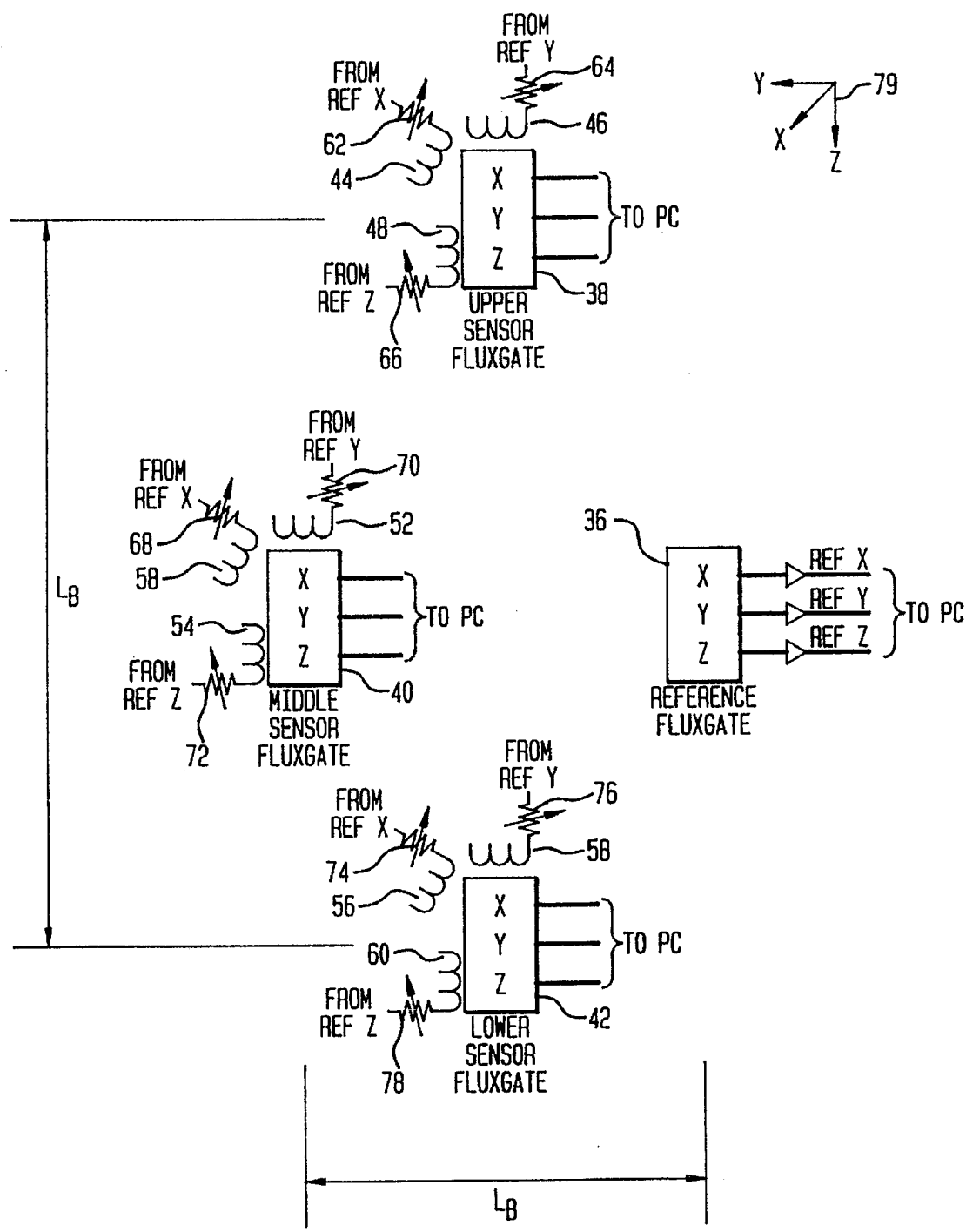
FIG. 2 is a schematic representation of a three sensor, one reference fluxgate TSG which can measure the complete magnetic field gradient tensor.

The TSG of FIG. 2 can measure the complete magnetic field gradient tensor using one reference 36 and three sensor fluxgates 38, 40, 42. Each fluxgate measures the field in all three directions. The sensors are located in the plane of FIG. 2. Each of sensor fluxgates 38, 40, 42 has three field cancellation coils 44, 46, . . . . 60 around it that are driven by the three outputs (Ref x, Ref y and Ref z) of reference fluxgate 36. All 9 potentiometer adjustments 62, 64, . . . . 76 are made such that when a uniform magnetic field is applied in any direction, the fields at all three sensor fluxgate 38, 40, 42 positions are zero. This is the balance condition for the complete TSG. The arrangement shown in FIG. 2 is the parallel arrangement for the major coils. A series arrangement of the coils (e.g., 44, 50 and 56) is also possible.

In situations where the uniform field of the Earth is to be cancelled, such as applications where the sensor is operated outside, a single three-axis reference magnetometer will usually suffice. On the other hand, when operating in the presence of multiple nearby magnetic interference sources, such as within a hospital or laboratory environment, the use of multiple three-axis reference magnetometers strategically placed can be used to effectively cancel the magnetic interference from multiple local sources.

The magnetic field gradient tensor has 9 elements:

$$\begin{array}{ccc} \frac{\partial B_x}{\partial x} & \frac{\partial B_x}{\partial y} & \frac{\partial B_x}{\partial z} \\ \frac{\partial B_y}{\partial x} & \frac{\partial B_y}{\partial y} & \frac{\partial B_y}{\partial z} \\ \frac{\partial B_z}{\partial x} & \frac{\partial B_z}{\partial y} & \frac{\partial B_z}{\partial z} \end{array} \quad (1)$$

Ordinarily there are only 5 independent elements, since $\nabla \cdot B=0$ and $\nabla \times B=0$ in free space and at low frequencies, i.e. dc. The TSG can directly measure 6 terms in the gradient tensor. A right handed coordinate system 78 is defined on FIG. 2 such that the +x direction is perpendicular to the plane of the figure (i.e., up), the +y direction is from the reference fluxgate to the middle sensor fluxgate. Hence, the +z direction is from one outer sensor fluxgate 38 to the other outer fluxgate sensor 42. The right-most column in the tensor, i.e., the derivatives with respect to the z direction, can be directly measured by differencing the output of the upper and lower sensor fluxgates and dividing by their spatial separation, which is defined as $L_B$. The middle column of the tensor, i.e., the derivatives with respect to the +y direction, can be measured by subtracting the averaged output of the upper and lower fluxgates from the middle fluxgate output and dividing by $L_B/2$. The gradients in the left-most column, which are derivatives perpendicular to the plane of the gradiometer, can be determined using $\nabla \cdot B=0$ and $\nabla \times B=0$. In this way, all the spatial derivatives of the magnetic field can be measured using four fluxgates mounted in a plane configuration.

The balance of a gradiometer is defined as the apparent gradient signal at the output when a uniform magnetic field is applied. The gradiometer balance, b has the units of $m^{-1}$. The true gradient for any of the gradient tensor elements, $G^{true}$, is given by $$G_k^{true} = G_k^{measured} - \sum_{j=x,y,z} b_{k,j} B_j \qquad (2)$$

where k=1,2 ... 9 corresponds to the 9 gradient tensor elements. $G_k^{measured}$ is the k'th measured gradient, $b_{k,j}$ is the gradiometer balance in either the j=x, y, or z direction for the k'th gradient, and $B_j$ is the field measured by the reference fluxgate in the j'th direction.

In addition to the balance as a gradiometer involving the difference between two magnetometer channels, a TSG has a magnetometer balance. The magnetometer balance is defined as the apparent magnetic signal at the output of a single sensor when a uniform magnetic field is applied. The magnetometer balance, $\beta$, is dimensionless. The true, non-uniform component of the field for any of the 3 sensor fluxgates $B^{true}$, is given by $$B_k^{true} = B_k^{measured} - \sum_{j=x,y,z} \beta_{k,j} B_j \qquad (3)$$

where k=1,2 ... 9 corresponds to the 9 magnetic field values measured by the sensor fluxgates. The gradiometer balance for a particular gradient channel is equal to the difference in the two relevant magnetometer balances divided by the baseline for that pair. Ideally the gradiometer and magnetometer balance are equal to zero, but inaccuracies in the fabrication of the instrument and cross talk between the pairs of Helmholtz-like coils makes them nonzero.

The magnetometer balance numbers are either major or minor balance numbers. Major balance numbers are those where the measured magnetic field direction at a sensor fluxgate and the reference field direction are parallel. Minor balance numbers are those where the two directions are perpendicular. For a complete sensor as shown in FIG. 2, there are 9 major magnetometer balance numbers and 18 minor balance numbers. Only the major balance numbers can be adjusted using the circuitry shown in FIG. 2. Thus, major coils 44, 46, 48, . . . . 78 cancel the field applied to each sensor magnetometer where the cancelled field direction and reference field direction are approximately parallel.

With the feedback coils deactivated, the major balance numbers are all equal to about ±1.0 and the minor balance magnitudes range from 0.0004 to 0.028 with an average value of 0.006. With the (major) feedback coils activated, all the balance magnitudes range from 0.0001 to 0.026 with an average value of 0.003, although the exact values will be determined by the setting of the 9 (major) balance correction adjustments, i.e. those adjustments shown in FIG. 2. The minor balance values ideally should be equal to zero, but because of cross talk between the field bucking coils and manufacturing imperfections, they are non-zero. While the major balance corrections may be adjusted to practically zero, the minor balance values cannot be zeroed with the circuit in FIG. 2.

As the sensor is rotated in a uniform field, there will be a measured signal on the output of the sensor fluxgates proportional to the magnetometer imbalance;

$$\Delta B^{measured} = \beta \Delta B^{rotation} \qquad (4)$$

where $\Delta B^{rotation}$ is the change in magnetic field in the reference frame of the sensor resulting from the rotation. When using very high resolution voltmeters to digitize the fluxgate outputs, the sensor exactly as depicted in FIG. 2 will work well in motion for larger changes in magnetic field from rotation. On the other hand, given a maximum $\beta$ of 0.026, a small amount of rotation will saturate a 16 bit A/D converter if the gain from the fluxgate outputs to the A/D input is adjusted such that the Least Significant Bit (LSB) of the A/D converter corresponds to the noise level of the sensor fluxgates.

Figure 3:
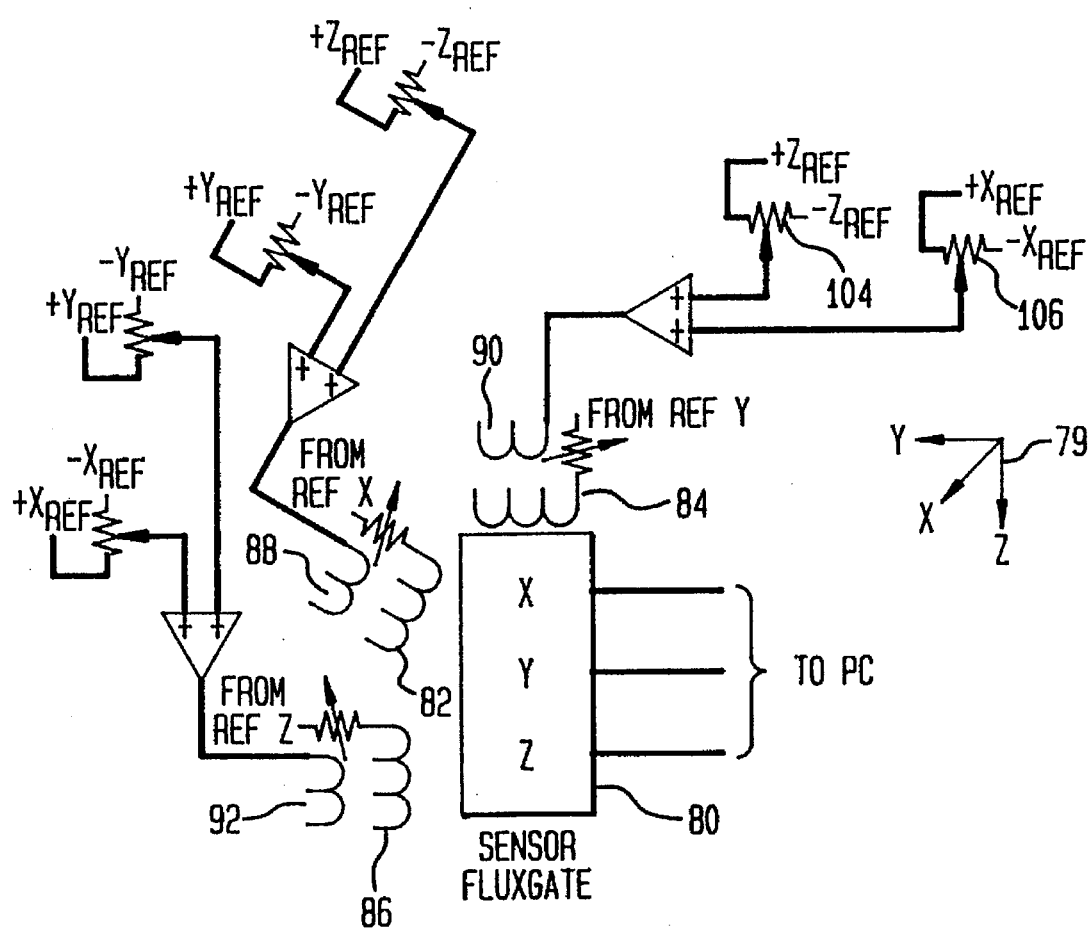
FIG. 3 is a schematic representation of the use of the minor correction circuits of the invention on a single sensor fluxgate.

FIG. 3 illustrates the use of minor correction circuits on a single sensor fluxgate 80 to allow a less expensive digitization system to be used while the sensor is undergoing large angle rotations. By using six Helmholtz-like coil pairs around each sensor fluxgate, three major 82, 84, 86 and three minor 88, 90, 92, all 27 magnetometer balance magnitudes can be adjusted to any value. In this way, when a uniform magnetic field is applied in any of the three coordinate directions, the potentiometers can be adjusted so none of the 9 sensor fluxgate outputs undergo any change. In practice, all 27 balance values can be adjusted to be less than 0.001. This allows a simple 16 bit A/D converter to be used in conjunction with 360° rotations.

While the major coils are designed to cancel the entire Earth's field, the maximum fields that can be generated by the minor coils is much less than 50 µT. The minor correction circuits need to be "bipolar" because, a priori, the sign on the minor corrections are not known. Thus, the minor coils (e.g., 88, 90, 92) cancel the field applied to each sensor magnetometer where the cancelled field direction and the referenced field direction are approximately perpendicular. The fields to be cancelled arise principally from cross-talk and manufacturing variations in the magnetometers. The minor (or secondary) coils are usually always connected in parallel, but a series configuration may also be used. Thus, depending upon the application, the major (or primary) coils may either be in series or in parallel while the secondary coils may be either in series or in parallel.

Alternative to having pairs of coils, e.g., 84/90, secondary coil 90 could be eliminated by feeding the outputs from the ±Zref and ±Xref into coil 84 after the variable resistors (e.g., 104, 106) shown. One, two or all three of the secondary coils could be eliminated this way for the three sets of coils shown on FIG. 3. Similarly, this could be extended to one or more of the other sensor fluxgates (not shown on FIG. 3) and the coils eliminated need not be the same for one or more of the sensor fluxgates.

When making estimates of the true gradient, $G_k^{measured}$, often an eddy current correction, e, is made. This consists of adding a term to Eq. 2 of the form $$-\sum e_{k,j} \frac{\partial B_j}{\partial t} \qquad (5)$$

where j=x,y,z. This corrects the value of $G_k^{measured}$ for simple eddy currents generated in the conducting parts of the sensor as it is rotated. It is a crude correction for the differences in the eddy current signal between the various channels. The eddy current correction magnitude for this sensor ranges from $2\times10^{-4}$ s/m to $1\times10^{-5}$ s/m across the magnetometer channels. The predicted value, based on the size of the metallic parts in the center of the sensor was $7\times10^{-5}$ s/m.

Figure 4A:
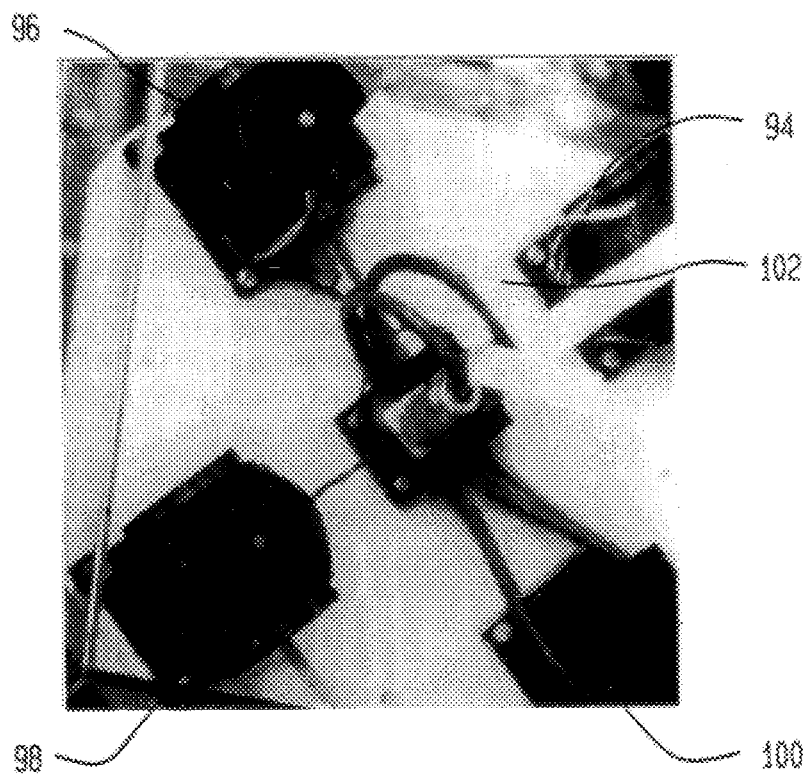
FIG. 4A and 4B are photographs of the rtTSG of this invention.
Figure 4B:
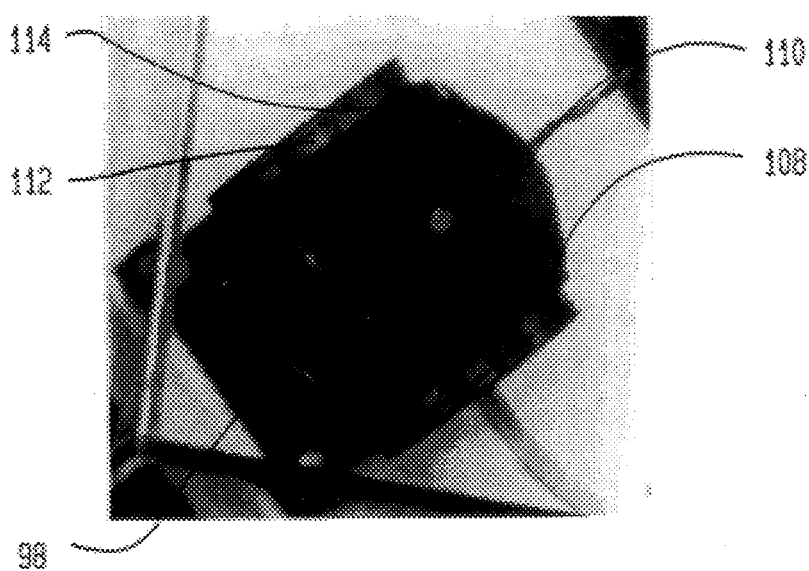

FIG. 4A and 4B show the room temperature (rtTSG) version of the gradiometer of this invention enclosed in a clear plastic box. The four fluxgate magnetometers 94, 96, 98, 100 (Billingsly Magnetics Model DM60-3AR) are mounted on a thick plate of MACOR 102 for mechanical stability. As can be seen, around three of the fluxgate magnetometers (94, 98, 100), are three sets of orthogonal copper Helmholz-like coils per magnetometer. These are the three sensor fluxgates and the coils are the major and minor correction coils. In FIG. 4B, coils 110 and 114 which constitute the major correction coil for one axis are wound closest to the body of fluxgate 98 while coils 108 and 112 which constitute the corresponding minor correction coil are wound further away from the fluxgate. The two coils that form each coil are spaced further apart than true Helmholz coils in order to reduce the complexity of fabrication. The coils were wound from 36 gauge insulated copper wire of the type commonly used for transformers. The major coils were of 900 turns (each half) and were 2 inches in diameter while the minor coils were of 300 turns (each half) and were of the same diameter. The remaining fluxgate, without the coils, is reference fluxgate 96.

The fluxgates are mounted on plate 102 in a square pattern that is 0.1904 m on the side. The axis of each fluxgate is aligned with the diagonals of this square so that the baseline $L_B$ is 0.2693 m. The fluxgate responsivity is $10^5$ Volts/Tesla. The plastic box was added for mechanical protection of the sensor.

Not shown in FIGS. 4A and 4B is a rack-mounted box that is used to house the commercial fluxgate control electronics, the 27 balancing potentiometers and the circuits for generating and adjusting the currents for the field cancellation coils. Also not shown is a commercial low pass filter bank and a computer that is used to process the data. The twelve low pass filters are typically set to a cutoff frequency of 3 Hz and a voltage gain of 100 times. The data is digitized using a 16 bit A/D converter in the computer at 7.5 samples per second per channel. The computer records and analyzes the data in real time. The differencing of the magnetometer outputs were done in software after the individual fluxgate outputs were digitized. The software has the ability to record and display the individual magnetometer or gradiometer outputs with or without balance corrections in real time, to compute the balance and/or power spectrum of a magnetometer or gradiometer channel, and to track the location of a magnetic object in real time using the Frahm-Wynn tracking method (FWM). The software can also determine the optimal settings for the balance potentiometers. The computer can display the data either in a digital strip chart recorder or a XY plot format. The Frahm-Wynn method is described by Wynn et al. in "Advanced Superconducting Gradiometer/Magnetometer Arrays and a Novel Signal Processing Technique" in IEEE Transactions on Magnetics, vol. MAG-11, no. 2, March 1975, pp. 701-707 which is herein incorporated by reference.

The balance of the rtTSG was measured by slowly rotating the instrument in a uniform magnetic field. During this rotation, the computer recorded the outputs of all the reference and sensor fluxgates. After about 140 seconds of data were recorded, the computer solved for the unknown b and β in Eqs. 2 and 3 using a least squares fitting method. Using these results, the positions of the adjustment potentiometers (the means for balancing the gradiometer), and a simple proportional feedback algorithm the computer instructed the operator how to adjust each potentiometer to reduce the balance error. This process was repeated several times to reduce the magnetometer balance error to 0.001 or less on all twelve magnetometer channels. Once balanced, the instrument remains in balance indefinitely under normal conditions.

Figure 5:
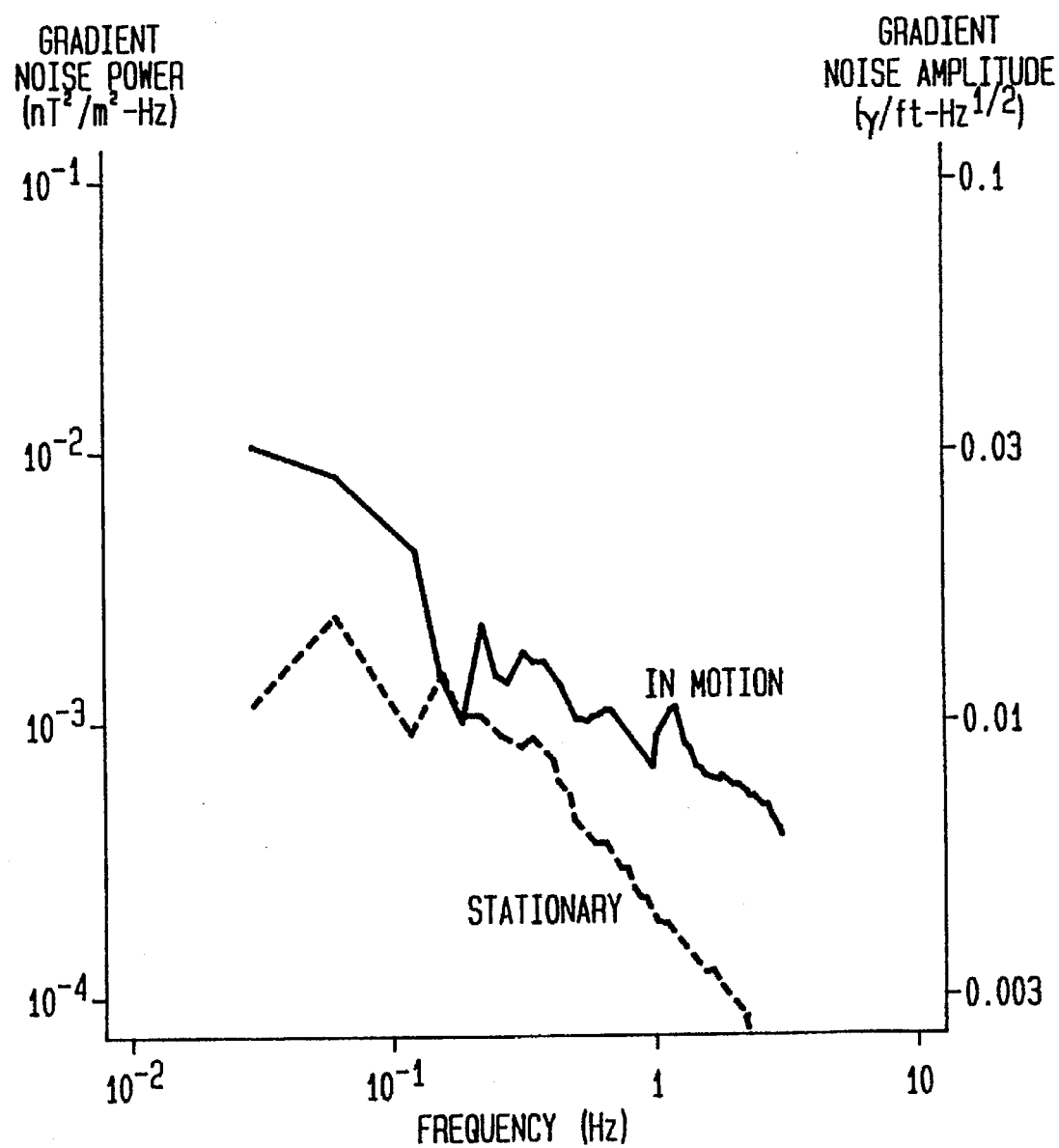
FIG. 5 is a graph of the measured gradient noise spectra of the rtTSG while the sensor is stationary and is in motion.

FIG. 5 is plot of the measured gradient noise spectra of the rtTSG while the sensor is stationary and in motion, respectively. Each line in FIG. 5 is a simple average of the measured spectra for the 6 directly measured gradients. The motion corresponds for three independent sinusoidal-like rotations having a frequency of approximately 0.2 Hz and an amplitude of ±3°. This motion is typical for a moving platform. The power spectra for the 3 gradients measured in the y direction are approximately twice the magnitude of the 3 gradients measured in the z direction because of the different baseline between the two measurements. The noise when stationary is dominated by the self-noise of the fluxgate sensors. In motion, the noise increases somewhat. For much larger rotations, for example rotations to ±45°, the noise increases at low frequencies. The increases in noise in both cases are related to the fact that in the present realization of the rtTSG, the balance numbers are not strictly independent of the applied field which was the assumption used in the data processing, i.e. Eqs. 2 and 3.

A test was performed to demonstrate the tracking ability of the rtTSG. The house-like outline on FIGS. 6(b), 6(c), and 6(d) represents a nonmagnetic test structure. The sensor was located on the second floor. The sensor was placed on a 3-axis rotating table. In this experiment a permanent magnet having a dipole magnetic moment of 61 Am², was walked around the sensor in the course of about 2 minutes. The magnet was an ALNICO magnet weighing about 1.5 kg. The computer digitized the 12 outputs of the rtTSG, corrected for the imbalance of the gradiometer (using Eqns. (2) and (3)), corrected for eddy currents using Eqn. (5) and displayed the data shown in the figure in real time.

Figure 6A:
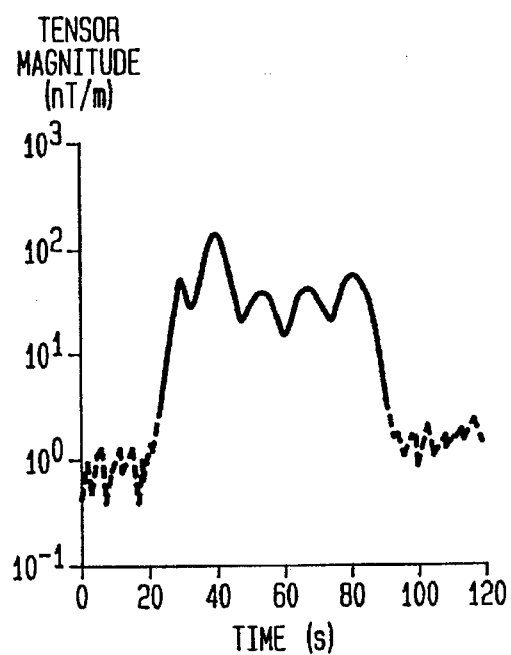
FIG. 6A–6D show the results of a demonstration of the tracking ability of the rtTSG.
Figure 6B:
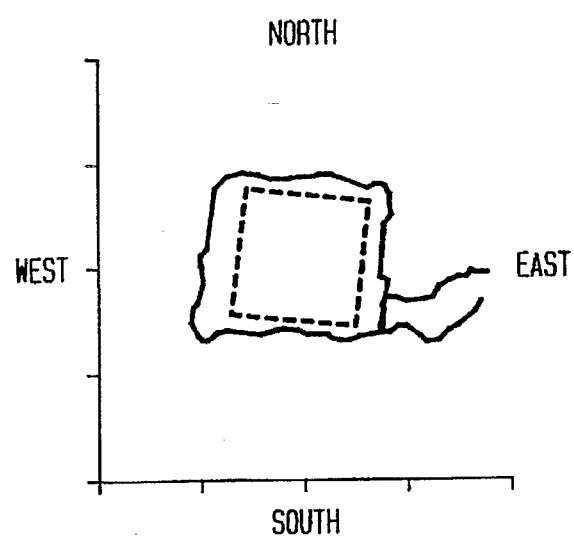
Figure 6C:
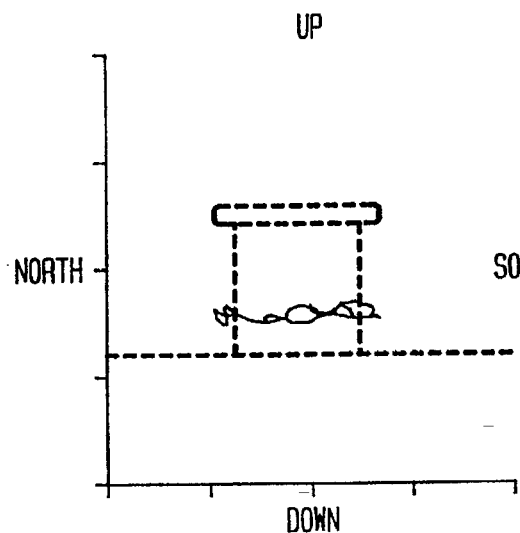
Figure 6D:
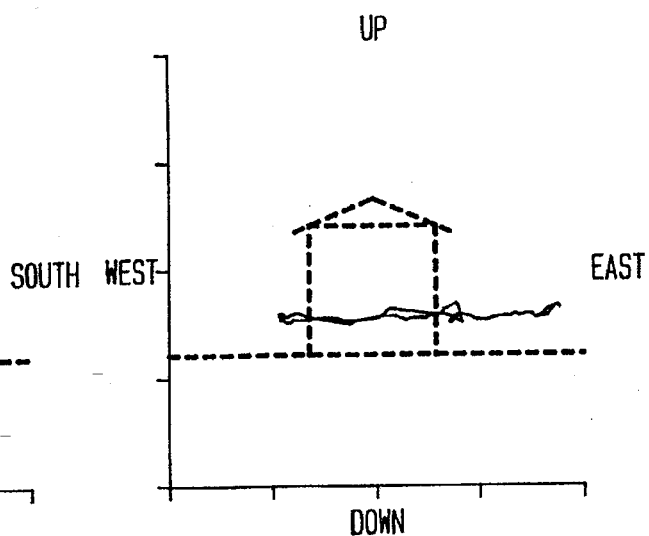

FIG. 6(a) is a plot of the gradient tensor magnitude, $$G \equiv \sqrt{\sum_{i,j=x,y,z} \left(\frac{\partial B_i}{\partial x_j}\right)^2} \qquad (6)$$

vs. time. The gradient tensor magnitude is a scalar measure of the size of the magnetic field gradient at the sensor location, and can be used as a simple scalar indicator of the presence of any nearby magnetic objects.

When the tensor magnitude was greater than $3\times10^{-10}$ T/m, the computer used the FWM to solve for the location of the magnet. Given the value of the magnetic field gradient tensor at one point in space and time and the fact this gradient is created by a single nearby magnetic dipole, mathematically there are four possible solutions for the physical reality. All are equally valid. While the direction of each solution from the measurement position can be determined, only the product of the magnetic moment and the fourth power of the distance from the gradiometer to the moment can be determined. The FWM converts the measured value of the gradient tensor into the four possible solutions.

In this experiment the computer was given the magnetic moment of the magnet being moved, which allowed the computer to calculate the exact range of the magnet. The computer was also given the fact that the sensor was at a higher elevation than the magnet. The solutions for the possible magnetic moment positions are grouped into two pairs of two. The positions within each pair are symmetric reflections of each other through the gradient measurement location. If the true target is below the plane of the sensor, there will be a solution in the opposite direction, i.e., above the plane of the target. The computer could eliminate as false the two solutions that were above the plane of the gradiometer. The two remaining solutions were at the approximate correct elevation. The solutions for the dipole position vary smoothly and continuously as the magnet moment is moved in space. However, the sequence of the four FWM solutions will vary between successive applications with only minor changes in the gradient inputs, e.g., the physical coordinates for the first and third solutions will spontaneously interchange at times.

Since the physical solutions always vary smoothly, the software first sorts the four solutions after each application of the FWM based on their physical location. While the target was translated only horizontally as it was being walked around, one solution, the false solution, under went large vertical and horizontal motions, while the other, the true solution, only moved horizontally. In this way one solution could be selected as the true solution and its range uniquely determined. It should be understood that the term tracking a magnetic object includes locating a stationary magnetic object as well.

Figure 7:
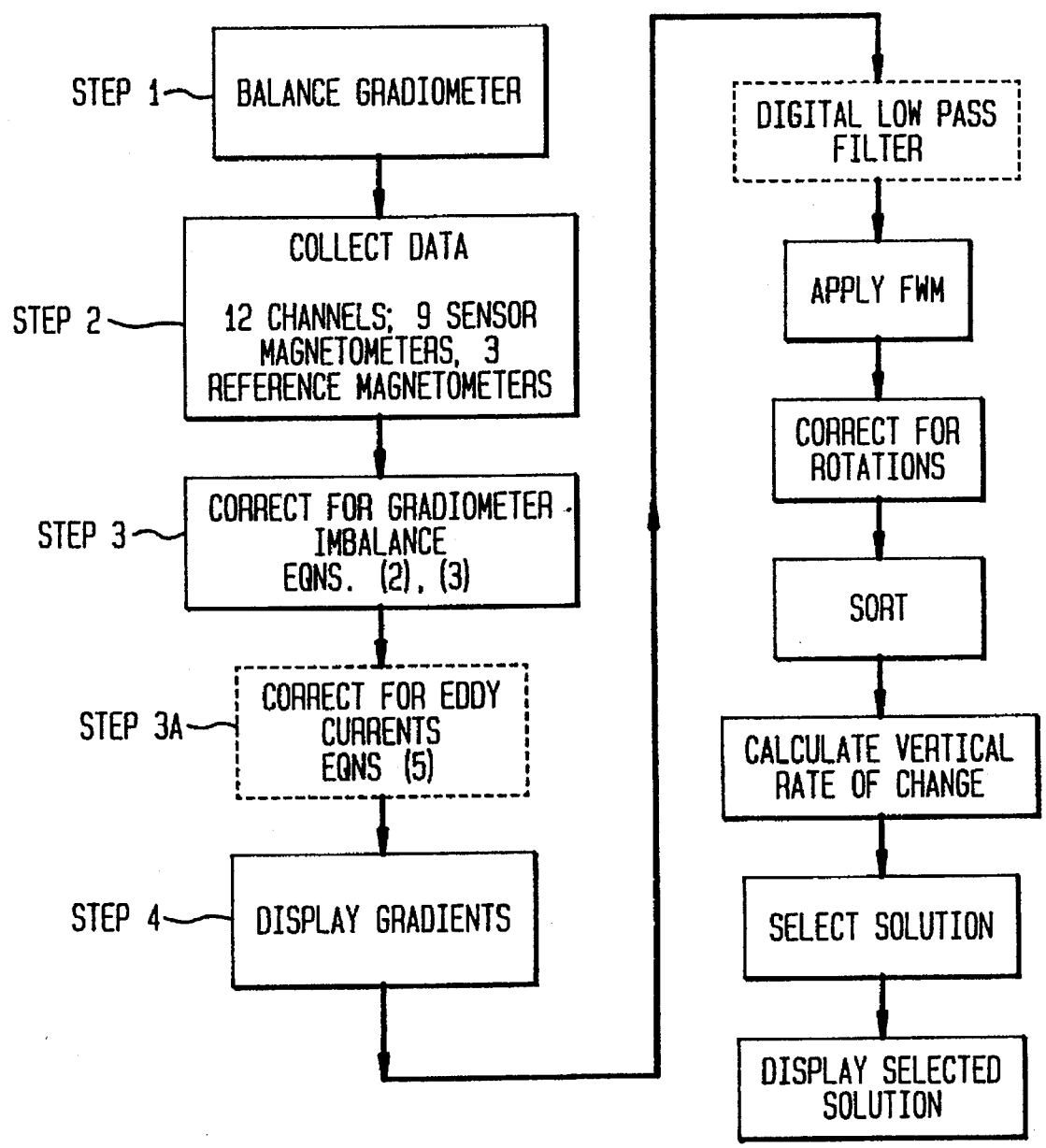
FIG. 7 is a flow chart of the data processing flow for the rtTSG.

The data processing flow for the gradiometer of the invention is given in FIG. 7 with optional steps shown in dashed boxes. If the gradiometer is used only to determine gradients, the processing stops with the block labelled "Display Gradients".

It should also be appreciated that the principles of this invention are also applicable to the magnetometer cubes of the U.S. Pat. No. 5,122,744.

While there have been described herein what are considered to be preferred and exemplary embodiments of the present invention, other variations of the invention shall be apparent to those skilled in the art from the teachings herein, and it is, therefore, desired to be secured in the appended claims all such variations as fall within the spirit and scope of the invention.

Having thus described our invention what we claim as new and desire to secure as Letters Patent, is:

1. A gradiometer for measuring a magnetic field gradient, comprising:
   a) one or more sensor magnetometers, each having a major and a separate minor correction coil associated therewith; and
   b) one or more reference magnetometers, each of which generates signals for application to said major and said minor correction coils.

2. The gradiometer of claim 1 having a plurality of said sensor magnetometers wherein said major correction coils are connected in series while said minor correction coils are connected in series.

3. The gradiometer of claim 1 having a plurality of said sensor magnetometers wherein said major correction coils are connected in series while said minor correction coils are connected in parallel.

4. The gradiometer of claim 1 having a plurality of said sensor magnetometers wherein said major correction coils are connected in parallel while said minor correction coils are connected in series.

5. The gradiometer of claim 1 having a plurality of said sensor magnetometers wherein said major correction coils are connected in parallel while said minor correction coils are connected in parallel.

6. A gradiometer for measuring a magnetic field gradient, comprising:
   a) one or more sensor magnetometers, each having a correction coil associated therewith;
   b) one or more reference magnetometers, each of which generates major and minor correction signals for application to said correction coil.

7. A gradiometer for measuring a magnetic field gradient, comprising:
   a) one or more sensor magnetometers, each having one or more separate correction coils associated therewith;
   b) one or more reference magnetometers, each of which generates major and minor correction signals for application to said one or more correction coils.

8. A gradiometer for measuring a magnetic field gradient, comprising:
   a) three three-axis sensor magnetometers, each of said magnetometers having associated therewith three major correction coils and three minor correction coils; and
   b) one three-axis reference magnetometer for supplying output signals to said major and minor correction coils.

9. A gradiometer system for measuring a magnetic field gradient, comprising:
   a) one or more sensor magnetometers, each having a major and a minor correction coil associated therewith and each producing one or more outputs;
   b) one or more reference magnetometers, each of which generates signals for application to said major and said minor correction coils;
   c) means for balancing said gradiometer; and
   d) means for computing one or more gradients from said one or more outputs.

10. The gradiometer of claim 9 further including means for calculating the time rate of change derivatives of said signals from said one or more reference magnetometers and means for correcting said gradients for the eddy current vector using said time derivatives.

11. A gradiometer system for measuring a magnetic field gradient, comprising:
   a) three three-axis sensor magnetometers, each of said magnetometers having associated therewith three major correction coils and three minor correction coils each of said sensor magnetometers producing three sensor output signals;
   b) one three-axis reference magnetometer for supplying reference output signals to said major and minor correction coils;
   c) means for balancing said gradiometer; and
   d) means for computing the field gradients from said sensor output signals.

12. The gradiometer of claim 11 further including means for calculating the time rate of change derivatives of said signals from said one or more reference magnetometers and means for correcting said gradients for the eddy current vector using said time derivatives.

13. A gradiometer system for tracking a magnetic object comprising:
   a) three three-axis sensor magnetometers, each of said magnetometers having associated therewith three major correction coils and three minor correction coils, each of said sensor magnetometers providing three sensor output signals;
   b) one three-axis reference magnetometer for supplying reference output signals to said major and minor correction coils;

c) means for balancing said gradiometer;

d) means for correcting the imbalance of said gradiometer;

e) means for computing the gradient signals from said sensor output signals;

f) means for computing the Frahm-Wynn algorithm to obtain four solutions using said gradient signals;

g) means for sorting the four solutions to determine positions;

h) means for computing the vertical rate of change of said four solutions;

i) means for rejecting one or more of said four solutions based on said one or more solutions residing in physically impossible places; and j) display means for displaying one or more of said solutions.

14. The system of claim 13 further including means for calculating the time rate of change derivatives of said signals from said reference magnetometer and means for correcting said gradients for the eddy current vector using said time derivatives.

15. A method for calculating magnetic gradients from data from a gradiometer comprising three three-axis sensor magnetometers having associated therewith three major correction coils and nine minor correction coils, each of said sensor magnetometers producing three sensor output signals, and one three-axis reference magnetometer for supplying reference output signals to said major and minor correction coils, the method comprising the steps of:

a) collecting the analog signals corresponding to the fields in the x, y and z directions from each of said sensor magnetometers;

b) digitizing said analog signals;

c) balancing said gradiometer; and d) computing the gradient signals from said the three-axis sensor magnetometers.

16. The method of claim 15 further including the steps of calculating the time rate of change of the signals from the reference magnetometer and correcting said gradient signals for the eddy current vector of said gradiometer using said time derivatives.

17. A method for tracking magnetic objects with a gradiometer comprising three three-axis sensor magnetometers having associated therewith three major correction coils and three minor correction coils, each of said sensor magnetometers providing three sensor output signals and one three-axis reference magnetometer for supplying reference output signals to said major and minor correction coils, the method comprising the steps of:

a) computing the gradient signals from said sensor output signals;

b) computing the Frahm-Wynn algorithm to obtain four solutions using said gradient signals;

c) correcting said four solutions for rotations;

d) sorting said four solutions to determine positions;

e) calculating the vertical rate of change of said four solutions;

f) selecting the correct solution by rejecting all of said four solutions not residing in physically possible places; and g) displaying one or more of said solutions.

18. The method of claim 17 further including the steps of calculating the time rate of change of the signals from the reference magnetometer and correcting said gradient signals for the eddy current vector of said gradiometer using said time derivatives.

19. A gradiometer as claimed in claim 1, wherein each of said sensor magnetometers and said reference magnetometers is a magnetometer cube provided with a first magnetometer, a second magnetometer and a third magnetometer on respective non-parallel sides of said magnetometer cube so as to provide a plurality of sensor magnetometer cubes and reference magnetometer cubes.

20. A gradiometer as claimed in claim 19 wherein the number of sensor magnetometer cubes is three and the number of reference magnetometer cubes is one.

21. A gradiometer as claimed in claim 20 wherein said three sensor magnetometer cubes and said one reference magnetometer cube are all situated in a common plane.

\* \* \* \* \*